(12) United States Patent
Le et al.

(10) Patent No.: US 11,778,723 B2
(45) Date of Patent: Oct. 3, 2023

(54) CIRCUIT BOARD AND A DRIVING POWER SUPPLY WITH THE CIRCUIT BOARD THEREOF

(71) Applicants: Self Electronics Co., Ltd., Zhejiang (CN); Wanjiong Lin, Zhejiang (CN); Self Electronics USA Corporation, Norcross, GA (US)

(72) Inventors: Zai Le, Zhejiang (CN); Sheng Zhang, Zhejiang (CN); Lihong Tong, Zhejiang (CN)

(73) Assignee: Self Electronics Co., Ltd., Ningbo (CN)

( * ) Notice: Subject to any disclaimer, the term of this patent is extended or adjusted under 35 U.S.C. 154(b) by 0 days.

(21) Appl. No.: 17/645,455

(22) Filed: Dec. 22, 2021

(65) Prior Publication Data
US 2022/0201835 A1 Jun. 23, 2022

(30) Foreign Application Priority Data
Dec. 22, 2020 (CN) .......................... 202011555555.4

(51) Int. Cl.
*H05K 1/02* (2006.01)
*H05K 1/03* (2006.01)
(Continued)

(52) U.S. Cl.
CPC ............. *H05K 1/0203* (2013.01); *H05K 1/03* (2013.01); *H05K 1/09* (2013.01); *H05K 1/115* (2013.01);
(Continued)

(58) Field of Classification Search
CPC .......... H05K 1/0203; H05K 1/03; H05K 1/09; H05K 1/115; H05K 1/18; H05K 1/0209;
(Continued)

(56) References Cited

U.S. PATENT DOCUMENTS

| 6,691,408 B2 * | 2/2004 | Biron | H01R 12/52 |
| | | | 29/846 |
| 2011/0186335 A1 * | 8/2011 | Chang | H05K 1/0207 |
| | | | 29/852 |

(Continued)

FOREIGN PATENT DOCUMENTS

| CN | 205291765 U | * | 6/2016 |
| CN | 205364691 U | * | 7/2016 |
| CN | 109397786 A | * | 3/2019 |

OTHER PUBLICATIONS

CN-205364691-U Translation (Year: 2023).*
CN-205291765-U Translation (Year: 2023).*
CN-109397786-A Translation (Year: 2023).*

*Primary Examiner* — Hoa C Nguyen
*Assistant Examiner* — John B Freal
(74) *Attorney, Agent, or Firm* — Wang Law Firm, Inc.

(57) ABSTRACT

A circuit board has a main board with a base material of insulating material, at least one metal base copper clad laminate, and each metal base copper clad laminate is provided with at least one component and a pin connected with the main board. The circuit board and the driving power supply with the circuit board have simple structure and low manufacturing cost, and are convenient for automatic manufacturing. The power device can be directly mounted on the metal substrate through the automation equipment, so that the metal substrate can realize the function of the heat sink, thereby improving the production efficiency and reducing the process quality hidden danger; at the same time, the grounding problem of the metal substrate is solved, and the EMC problem is avoided.

6 Claims, 6 Drawing Sheets

(51) Int. Cl.
*H05K 1/09* (2006.01)
*H05K 1/11* (2006.01)
*H05K 1/18* (2006.01)

(52) U.S. Cl.
CPC ......... *H05K 1/18* (2013.01); *H05K 2201/032* (2013.01)

(58) Field of Classification Search
CPC ...... H05K 1/056; H05K 1/141; H05K 1/0207; H05K 1/02; H05K 2201/032; H05K 2201/066; H05K 2201/10303; H05K 2201/10401; H05K 2201/10416
See application file for complete search history.

(56) References Cited

U.S. PATENT DOCUMENTS

2019/0104237 A1\* 4/2019 Sugiyama .............. H04N 23/54
2020/0344924 A1\* 10/2020 Harrigan ................ H05K 3/341

\* cited by examiner

CIRCUIT BOARD AND A DRIVING POWER SUPPLY WITH THE CIRCUIT BOARD THEREOF

RELATED APPLICATION

This application claims the benefit of priority to Chinese Patent Application No. CN 202011555555.4, filed on Dec. 22, 2020.

FIELD OF THE TECHNOLOGY

The present invention relates to the field of driving power supply heat dissipation, in particular a circuit board and a driving power supply with the circuit board.

BACKGROUND OF THE INVENTION

Electronic products being more and more widely used, the use of electronic products is inseparable from the power supply, and the driving power supply (switching power supply) is needed to connect the electronic products with the mains for supplying the power to electronic products. The driving power supply includes housing and a circuit board installed in the housing, and the bottom surface of the PCB is generally close to the inner wall of the housing, and the heat dissipation effect is poor.

In order to solve the above problem, the traditional method is to install a heat sink for the power device with serious heating in the working process, and the heat sink and the power device are fastened together by a screw or an insulating heat pad. The way is generally implemented by manual, wherein there is a possibility of damage to power devices, low production efficiency, and use artificial defects.

BRIEF SUMMARY OF THE INVENTION

In view of this, the present invention provides a circuit board and a driving power supply with the circuit board to solve the above technical problems.

A circuit board includes a main board with a base material of insulating material, further comprising at least one metal base copper clad laminate, and each metal base copper clad laminate is provided with at least one component and a pin connected with the main board.

advantageously, a metal base of the metal base copper clad laminate is grounded.

advantageously, the metal base copper clad laminate includes an aluminum base layer, an insulating layer, and a copper foil layer.

advantageously, the metal base copper clad laminate is provided with a through hole, and a weldable rivet is provided on the through hole, and one end of the rivet is electrically connected with the aluminum base layer, and the other end of the rivet is connected with the copper foil layer through solder connection, and then the copper foil layer is directly or indirectly connected to the main board so that the aluminum base layer is grounded.

advantageously, the metal base copper clad laminate uses a copper base, including copper base layer, insulating layer and copper foil layer.

advantageously, the copper base layer is welded to a ground contact of the main board.

advantageously, the component is a power device.

A driving power supply includes a power supply box and a circuit board as mentioned above arranged in the power supply box.

2

The technical effects of the present invention:

The circuit board of the invention and the driving power supply with the circuit board have simple structure and low manufacturing cost, and are convenient for automatic manufacturing. The power device can be directly mounted on the metal substrate through the automation equipment, so that the metal substrate can realize the function of the heat sink, thereby improving the production efficiency and reducing the process quality hidden danger; At the same time, the grounding problem of the metal substrate is solved, and the EMC problem is avoided.

BRIEF DESCRIPTION OF THE DRAWINGS

Embodiments of the present invention will be described below with reference to the drawings, in which.

DETAILED DESCRIPTION OF THE INVENTION

Specific embodiments of the present invention will be described in further detail below based on the drawings. It should be understood that the description of the embodiments of the present invention herein is not intended to limit the protection scope of the present invention.

Figure 1:
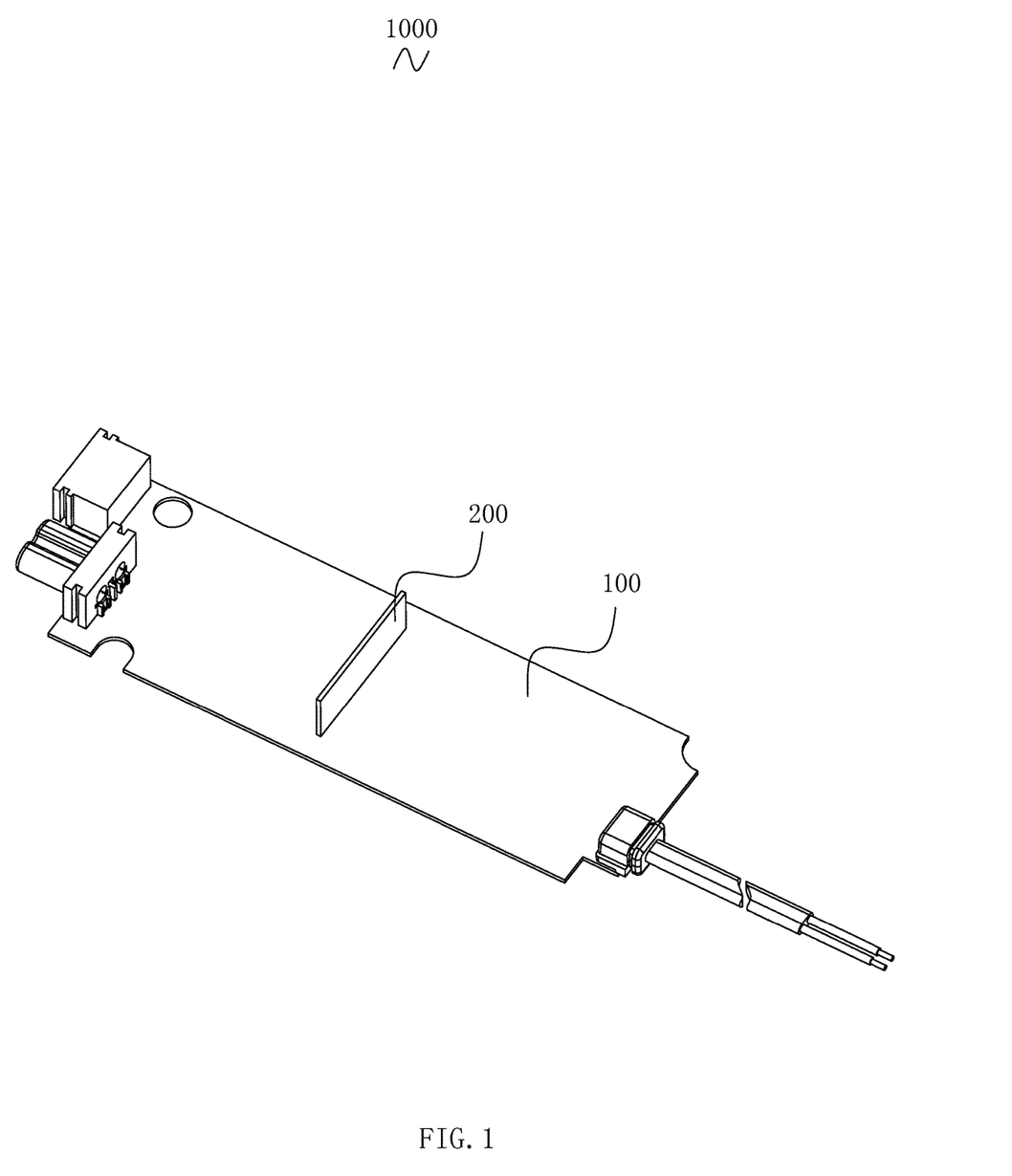
FIG. 1 is a schematic structural diagram of a circuit board in this embodiment.
Figure 2:
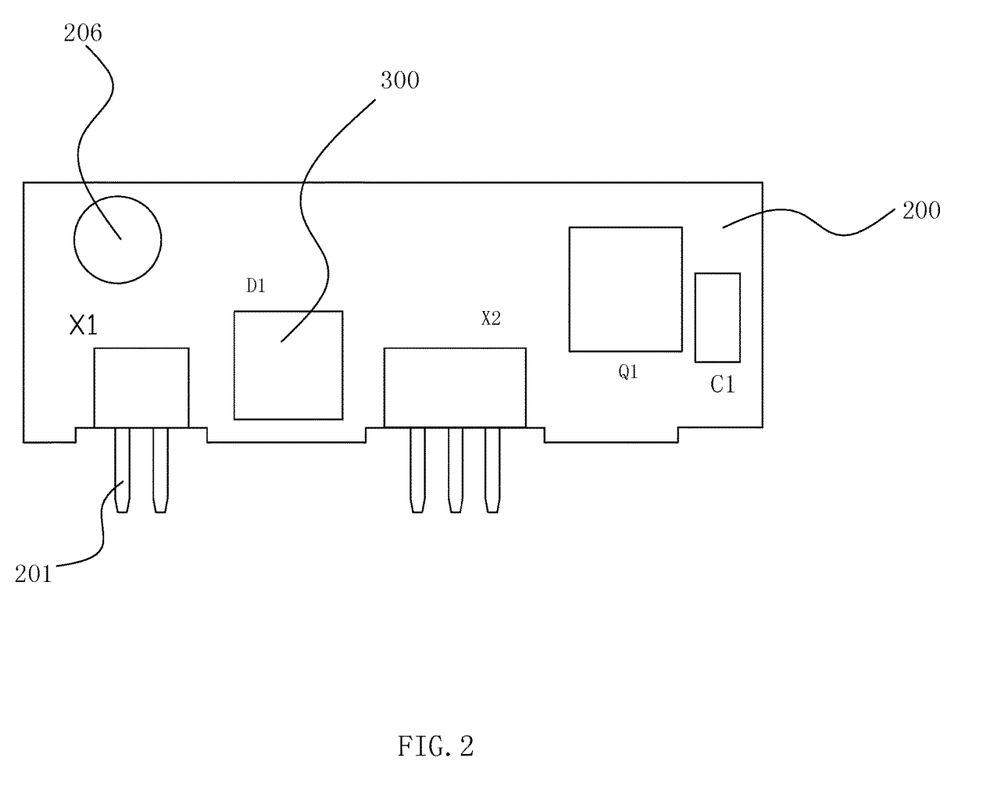
FIG. 2 is a structural diagram of a metal base copper clad laminate in this embodiment.
Figure 3:
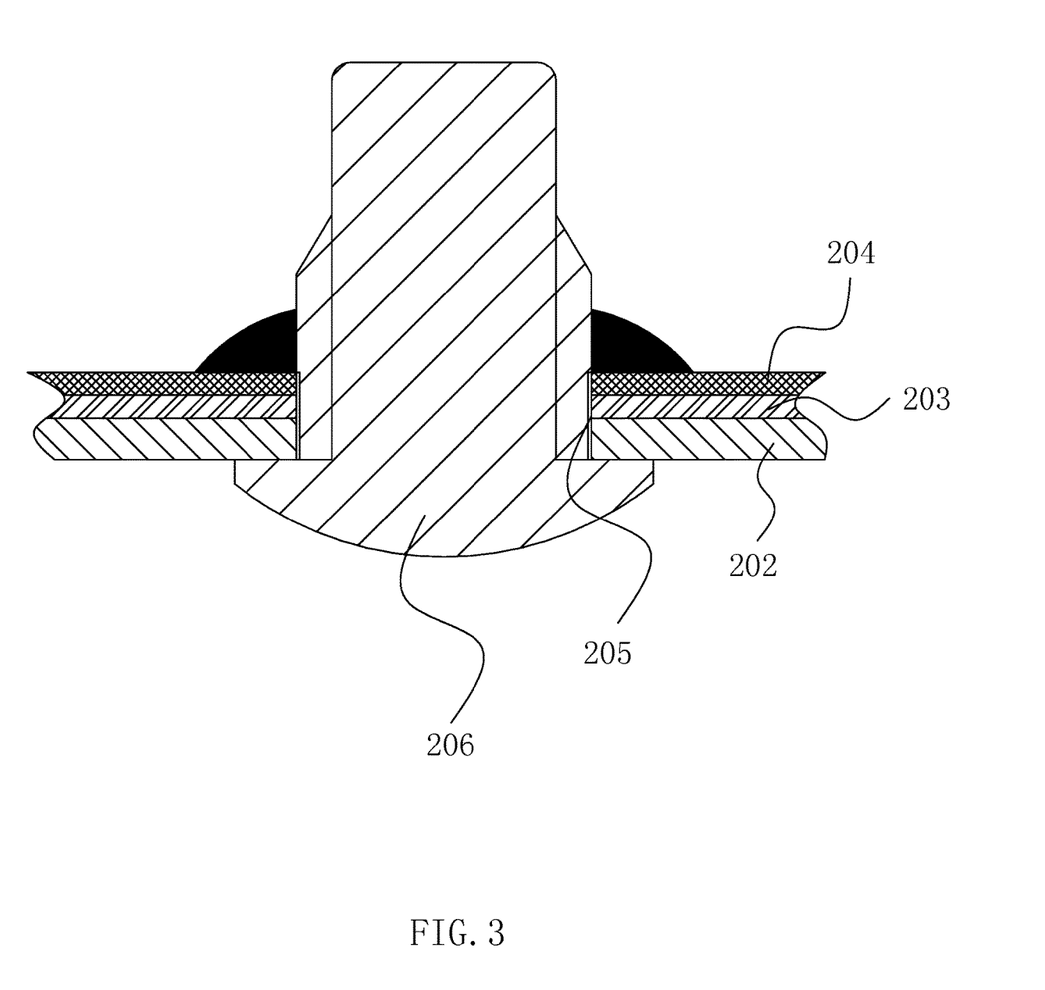
FIG. 3 is a cross-sectional view of a metal base copper clad laminate at the rivet in this embodiment.

As shown in FIG. 1-3, the circuit board 1000 in this embodiment includes a main board 100 with an insulating substrate and at least one metal base copper clad laminate 200.

The substrate of the main board 100 is generally classified as the insulating portion of the substrate, and the common raw materials are electric wooden boards, glass fiberboards, and various types of plastic sheets.

The metal base copper clad laminate 200 employed in the present embodiment is one of the coated copper laminate, with a single panel and a metal base. The Copper Clad Laminate (CCL) is made of Copper Clad Laminate (CCL) by hot pressing, and is referred to as Copper Clad Laminate for short. All kinds of printed circuit boards with different forms and functions are processed, etched, drilled and copper plated on coppered boards selectively to make different printed circuits. According to different insulation materials and structure of copper-clad plate, it can be divided into organic resin copper-clad plate, metal (core) copper-clad plate and ceramic copper-clad plate. The metal base copper clad laminate 200 typically consists of a three-layer structure, a copper foil layer (circuit layer), an insulating layer, and a metal base layer, respectively.

Each metal base copper clad laminate 200 is provided with at least one component 300 and a pin 201 connected with the main board 100. The number of pin 201 can be set according to the circuit structure, and the connection mode is welded by the pin and the slot board hole, which is not described in the prior art. The metal base copper clad laminate 200 and the main board 100 conduct on to form a complete circuit. For power devices with serious heating in the working process, in this embodiment such components are attached directly to the metal base copper clad laminate 200 through automatic equipment, and then connected with the main board 100 through pin 201. In this embodiment, the metal base copper clad laminate 200 completes the function of the heat sink at the same time, which improves the production efficiency and reduces the potential quality risks.

Since power devices with more severe heating usually work in the switching state, the switching signal will cause EMC problems, so it is generally necessary to ground the heat sink to change the coupling path of EMC. Preferably, the metal base of the metal base copper clad laminate 200 is grounded. The present invention solves the EMC problem caused by the switching signal of the power devices on the basis of realizing automatic patch technology. Grounding in electronic equipment is generally understood in two ways, one is directly connected to the grid earth, the other is connected to the electrical static point, that is, an internal "ground" in the electronic circuit. In such electrical applications the metal base copper clad laminate 200 needs to be connected with the main board 100, the second way is more commonly used, and the first way can also be, how to achieve electrical connection for the prior art is not described.

The physical significance of metal (aluminum, copper) substrate grounding is described as follows: In the field of electronic circuits, metal substrates are used not only to realize the installation and electrical connection of electronic components, but also to realize the heat dissipation of power devices on the metal substrate. Metal substrates equipped with electronic components are often used as a part of electronic products. In the working process, the electronic components on the metal substrate will have corresponding working voltage and current. When the metal substrate is installed on the actual electronic products, the electronic components on the metal substrate will produce potential difference with the surrounding devices. According to the electric field theory, an electric field will be generated between two different potentials, which may cause interference to other circuits and cause abnormal or failure of electronic products. Therefore, we will generally ground the metal substrate, the purpose of grounding is to shorten the electric field path, the electric field is limited in a small loop, eliminate the interference of the electric field on the surrounding devices. The coupling path and coupling area of the metal substrate will change greatly before and after grounding.

In this embodiment, the metal base copper clad laminate 200 comprises an aluminum base layer 202, an insulating layer 203 and a copper foil layer 204. That is, an aluminum substrate is used, an aluminum substrate is a metal base copper clad laminate having a good heat dissipation function, which is relatively common, and the procurement cost is low.

There is an insulating layer 203 as insulating medium between the aluminum base layer 202 and the copper foil layer 204 of the aluminum substrate to realize the insulation between different electrical circuits of the copper foil layer 204. Since the material of aluminum base layer 202 is aluminum, and direct soldering between aluminum base layer 202 and copper cannot be realized, so that the aluminum base layer 202 needs to be grounded in other methods. It is realized by rivet in this present embodiment, and the specific scheme is as follows: First, the electric connection between rivet 206 and aluminum substrate is realized by welding rivet 206, and the copper foil layer 204 of aluminum substrate and the rivet 206 is connected to each other by soldering tin, and then the copper foil layer 204 and the main board 100 are directly or indirectly connected to achieve the aluminum substrate grounding. The specific structure is as follows, the metal base copper clad laminate 200 is provided with a through hole 205, and the through hole 205 is provided with a welded rivet 206. One end of the rivet 206 is electrically connected with the aluminum base layer 202, and the other end of the rivet 206 is connected with the copper foil layer 204 through solder connection, and then the copper foil layer 204 is directly or indirectly connected to the main board 100 so that the aluminum base layer 202 is grounded.

In this embodiment, one metal base copper clad laminate 200 is provided, and five components 300 are attached to it.

Figure 4:
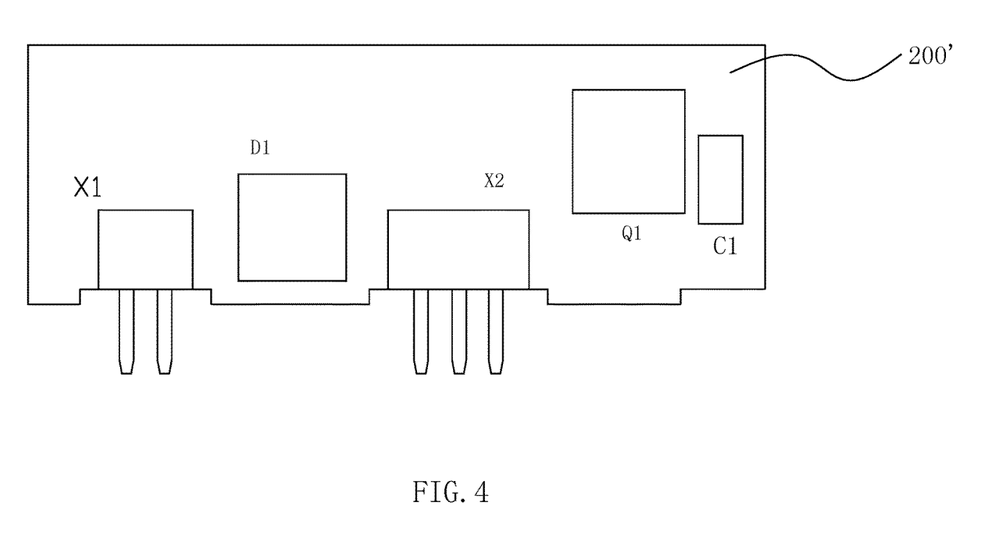
FIG. 4 is a schematic structural diagram of a metal base copper clad laminate in another embodiment.
Figure 5:
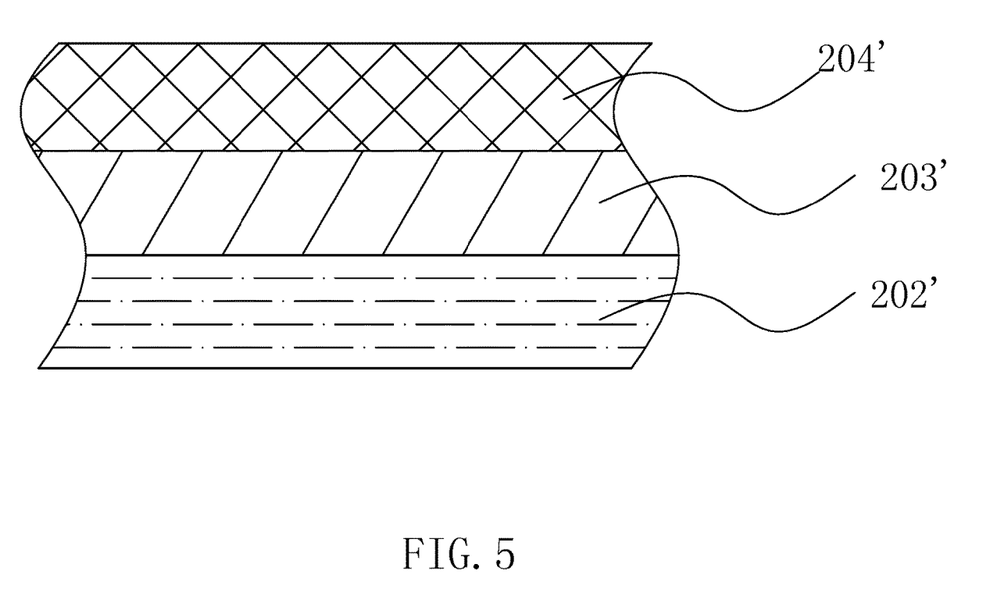
FIG. 5 is a cross-sectional view of a metal base copper clad laminate in another embodiment.

In addition to using an aluminum substrate, a copper substrate can be used, as shown in FIGS. 4 and 5, in another embodiment, the metal base copper clad laminate 200' uses a copper base, including a copper base layer 202', an insulating layer 203', and a copper foil layer 204'. The copper base layer 202' of the copper substrate can be electrically connected to the main board 100, the copper base layer 202' is welded to the ground contact of the main board 100.

The present invention aims at the heat dissipation problem of components whose dissipated power can reach class W or above in the circuit, and the component 300 is a power device. Specifically, the component 300 is a MOS tube, diode or other power devices.

Figure 6:
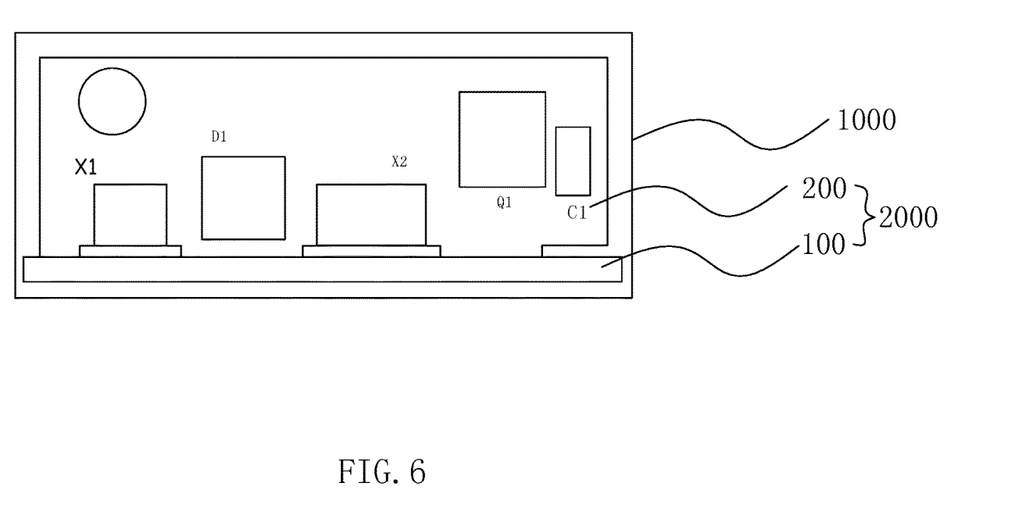
FIG. 6 is a cross-sectional view showing a driving power supply of this present embodiment.

As shown in FIG. 6, the driving power supply of this embodiment comprises a power supply box 2000 and a circuit board 1000 arranged in the power supply box 2000. The power supply box 2000 can adopt the existing structure, including input and output parts and other parts, which will not be described here as the prior art.

The above are only preferred embodiments of the present invention, and are not used to limit the protection scope of the present invention. Any modification, equivalent replacement or improvement within the spirit of the present invention is covered by the scope of the claims of the present invention.

What is claimed is:

1. A circuit board (1000) comprising a main board (100) with a base material of insulating material, at least one metal base copper clad laminate (200), and each metal base copper clad laminate (200) is provided with at least one component (300), a metal base which is grounded, and a pin (201) connected with the main board (100);

each metal base copper clad laminate (200) comprises an aluminum base layer (202), an insulating layer (203), and a copper foil layer (204).

2. The circuit board (1000) as claimed in claim 1, wherein the metal base copper clad laminate (200) is provided with a through hole (205), and a weldable rivet (206) is provided on the through hole (205), and one end of the rivet (206) is electrically connected with the aluminum base layer (202), and the other end of the rivet (206) is connected with the copper foil layer (204) through solder connection, and then the copper foil layer (204) is directly or indirectly connected to the main board (100) so that the aluminum base layer (202) is grounded.

3. The circuit board (1000) as claimed in claim 1, wherein the metal base copper clad laminate (200') uses a copper base, including copper base layer (202'), insulating layer (203') and copper foil layer (204').

4. The circuit board (1000) as claimed in claim 3, wherein the copper base layer (202') is welded to a ground contact of the main board (100).

5. The circuit board (1000) as claimed in claim 1, wherein the component (300) is a power device.

6. A driving power supply, comprising a power supply box (2000) and a circuit board (1000) as claimed in claim 1 arranged in the power supply box (2000).

* * * * *